United States Patent [19]

Griesshammer et al.

[11] 4,070,797
[45] Jan. 31, 1978

[54] NITROGEN-FREE ANIONIC AND NON-IONIC SURFACTANTS IN A PROCESS FOR PRODUCING A HAZE-FREE SEMICONDUCT

[75] Inventors: Rudolf Griesshammer; Helmut Kirschner; Günther Lechner, all of Burghausen, Germany

[73] Assignee: Wacker-Chemitronic Gesellshaft fur Elektronic Grundstoffe mbH, Burghausen, Germany

[21] Appl. No.: 702,376

[22] Filed: July 2, 1976

[30] Foreign Application Priority Data

July 14, 1975 Germany .............................. 2531431

[51] Int. Cl.$^2$ ................................................. B24B 1/00
[52] U.S. Cl. ........................................ 51/326; 51/308
[58] Field of Search ................. 51/293, 307, 308, 281, 51/326, 318; 106/3, 8

[56] References Cited

U.S. PATENT DOCUMENTS

| | | |
|---|---|---|
| 3,458,300 | 7/1969 | Duvall ..................................... 51/308 |
| 3,540,891 | 11/1970 | Muhler ................................... 51/308 |
| 3,576,750 | 4/1971 | Muhler ................................... 51/308 |
| 3,715,842 | 2/1973 | Tredinnick et al. ................... 51/308 |
| 3,754,941 | 8/1973 | Burke ..................................... 51/308 |
| 3,807,979 | 4/1974 | Cromwell .............................. 51/308 |
| 3,874,129 | 4/1975 | Deckert ................................. 51/326 |
| 3,877,183 | 4/1975 | Deckert et al. ....................... 51/308 |
| 3,922,393 | 11/1975 | Sears ...................................... 51/308 |
| 3,966,432 | 6/1976 | Rayner .................................. 51/308 |
| 4,022,625 | 5/1977 | Shelton .................................. 51/307 |

*Primary Examiner*—Donald J. Arnold
*Attorney, Agent, or Firm*—Allison C. Collard

[57] ABSTRACT

Process for making haze-free surfaces of semiconductor bodies which comprises a first step of polishing the surface by means of a polishing agent containing at least one member of the group consisting of quartz, silica, silicates and fluosilicates, and a second step of polishing the surface by means of a polishing agent containing in addition to the above defined agents from 0.1 to 10% by weight calculated on the polishing agent of a nitrogen-free surfactant selected from the group consisting of anionic and non-ionic surfactants, and a mixture thereof.

10 Claims, No Drawings

NITROGEN-FREE ANIONIC AND NON-IONIC SURFACTANTS IN A PROCESS FOR PRODUCING A HAZE-FREE SEMICONDUCT

The present invention relates to an improved process for making semiconductors having haze-free surfaces.

Semiconductor bodies need to have smooth surfaces if they are to be used as starting materials in the manufacture of electronic components, for example components of integrated circuits. In order to render the surfaces smooth, they may be polished with a polishing agent containing one or more of the following: quartz, a silica, silicates and a fluosilicate. The polishing agent may also contain an alkali, for chemical polishing. Such surfaces are free of defects, such as scratches or other disturbances brought about by mechanical working of the semiconductor, for example, saw-cutting of the semiconductor, or they may be the result of the lapping process. Such disturbances all result in a lowering of the yield of electronic components.

A test procedure has become accepted in the electronics industry for testing semiconductor surfaces for smoothness: the surfaces are viewed, in a darkened room, under a sharply focused intense light beam. Any disturbances of the crystal surface, and also any dirt particles or residues from previous washing processes, cause scattering of the light beam. Such disturbances can be detected more easily in this manner then by examination under a microscope.

When surfaces that have been polished in the manner described above are examined by this test procedure, it is found that any disturbances in the surface have been eliminated but that the surface is still slightly rough. This micro-roughness whose magnitude is similar to the wave length of light cannot be detected by the naked eye, or even under a microscope with a high degree of magnification, but it causes slight scattering of the focused light beam, which shows up as a milky-grey surface at the point of incidence of the beam. This phenomenon is known as "haze".

A process to produce substantially haze-free semiconductor surfaces is described in British patent specification No. 1,418,088, (DT-OS 2,247,067) in which process the semiconductor surface is first polished by means of a conventional polishing agent of the type described above and then polished by means of a second polishing agent containing in addition to the component or components mentioned above, from 1 to 10% by volume of a monohydric alcohol having 3, 4 or 5 carbon atoms and a small quantity of polyvinyl alcohol. Although the described process has the advantage of producing substantially haze-free semiconductor surfaces, it has the disadvantage that the high vapor pressure of some of the alcohols used which causes an unpleasant odor can be extremely annoying for the personnel operating the polishing machines.

It is the object of the present invention to provide a process for making polished "haze-free" surfaces on semiconductors with the use of odorless non-toxic agents. This object is accomplished according to the invention by polishing the surface of a semiconductor body in a first step by means of a polishing agent containing at least one of the following: quartz, silica, a silicate, and a fluosilicate, and polishing the surface in a second step by means of a polishing agent containing in addition to the above, from 0.1 to 10% by weight, calculated on the polishing agent of an anionic and/or non-ionic surfactant that is free of nitrogen.

Surprisingly, the additives used in the second polishing stage eliminate the micro-roughness of the surface and hence the semiconductor surfaces are substantially haze-free (optically smooth) and the yields of electronic components manufactured from semiconductor material polished in this way are not appreciably diminished through defective surface quality. The present process has the advantage over the process of the above-mentioned British Patent Specification No. 1,418,088 that the surfactants used as additives in the present process are substantially neutral-smelling and non-toxic.

Known polishing suspensions may be used for the first polishing step of the process. They advantageously contain precipitated silicates or fluosilicates as described in German Offenlegungschrift No. 1,752,163. Examples of such silicates are silicates of the metals of groups IIa, IIb, III and IIIb of the periodic system, for example, the silicates of zirconium, iron, lead, nickel, cobalt, magnesium, calcium, strontium, barium, zinc, and aluminium. Examples of fluosilicates are fluosilicates of the metals of groups I, II and III of the periodic system, for example, the fluosilicates of sodium, potassium, magnesium, calcium, barium, aluminium, and zinc. The size of the particles in the polishing suspension is advantageously within the range of from 5 to 200 mu.

Also useful as polishing agents are silica gels and silica sols as described, for example, in U.S. Pat. No. 3,170,273. Quartz powder as described, for example, in German Auslegschrift No. 1,219,764 can also be used as the polishing agent.

In most cases, the polishing agent additionally contains an alkali, as a chemically active component.

The polishing agent used for the second polishing step fundamentally contains the same constituents as employed in the first step, but it additionally contains from 0.1 to 10%, preferably from 0.5 to 5%, by weight of an anionic or non-ionic non-nitrogen-containing surfactant. The percentages relate to the polishing agent without additive.

Suitable anionic surfactants are, for example, salts of long-chain carboxylic acids, sulphuric acid esters, such as alkyl sulphonates and alkylarylsulphonates, and corresponding fluorinated compounds. Suitable non-ionic surfactants are, for example, various ethylene oxide adducts, for example, nonylphenol polyglycol ether or oxethylated polypropylene glycols, fatty acid monoglycerides, carbohydrate fatty acid esters, for example, saccharose monofatty acid, and corresponding fluorohydrocarbons. Non-ionic surfactants are preferably used.

As in the known polishing process, the duration of the first polishing step may be from 10 minutes to 2 hours. In the second step, polishing need be carried out, in most cases, only for 2 to 10 minutes.

It can be advantageous to carry out the two polishing steps on separate polishing machines, since otherwise surfactant suspended in the polishing cloth might reduce the amount of material removed by polishing. The machine used for the second polishing stage may be much simpler than that used for the first stage since the polishing time is much shorter and there is no need to apply much pressure during the second stage.

As well as the advantages already mentioned, the present process has the advantages that the surfactant may readily be removed from the semiconductor disc by washing with water and that the surfactant can have a cleaning effect on the semiconductor discs as well as on the polishing cloth, thus enabling it to be reused a number of times.

The semiconductor bodies to be polished are frequently in the form of discs. The process of the invention can be used for polishing various semiconductor materials, for example, silicon, germanium, and III-V semiconductors, for example, gallium arsenide and gallium phosphide.

In the following, a number of examples are given for the purpose of illustration and not of limitation.

EXAMPLE 1

Silicon discs of 50 mm diameter and 350 u thickness, which had been manufactured by sawing a monocrystalline silicon rod, were attached by means of wax onto a plane carrier plate of stainless steel and placed on the rotating plate of a polishing machine, over which a polishing cloth was stretched, and were subjected to a pressure of 0.2 kp/cm$^2$. The rotating plate was rotated at 90 rpm. A polishing suspension that had been prepared from 50 liters of waterglass (30% SiO$_2$) and 25 kg of calcium chloride hexahydrate in 600 liters of water, was dripped onto the rotating plate at a rate of about 25 ml/min. After polishing had been continued in this manner for about 1 hour, the surface of the silicon disc had been polished in the conventional sense: no flaws could be detected under a microscope with a thousand-fold magnification. However, on examining the surface under a focused light beam, a milky-grey haze was observed, caused by light scattered by the slightly rough surface. The discs were again placed on the polishing machine and 2% by weight of nonylphenyl ether was added to the polishing suspension. Polishing was then carried out for 5 minutes. Re-examination of the disc after this second polishing step showed that the surface was free of all scattered light: the surface appeared jet-black.

EXAMPLE 2

50 kg of quartz powder of particle size between 10 and 40 mu were suspended in 500 liters of water and sodium hydroxide solution was added to the suspension until its pH was between 9.5 to 10.5. The suspension thus prepared was used to polish gallium arsenide discs of 30 mm diameter, in the manner described in Example 1. The polishing agent was added at a rate of 30 ml/min. After polishing had been continued for about 1 hour, 1% by weight of isododecylbenzene sulphonate was added to the polishing suspension. Polishing was then continued for another 7 minutes. Examination of the discs under a focused light beam showed that the discs had flawless haze-free surfaces.

From the foregoing description, one skilled in the art can easily ascertain the essential characteristics of this invention, and without departing from the spirit and scope of the invention, can make various changes and modifications of the invention to adapt it to various usages and conditions. Consequently, such changes and modifications are properly, equitably, and intended to be, within the full range of equivalence of the following claims.

What is claimed is:

1. In a process for the production of a semiconductor having a haze-free surface by polishing the semiconductor with a polishing agent containing at least one member of the group consisting of quartz, silica, silicates and fluosilicates, the improvement which comprises further polishing the semiconductor in a second polishing step with a modified polishing agent containing said first-mentioned polishing agent and from 0.1 to 10% by weight, calculated on the weight of said first-mentioned polishing agent, of a nitrogen-free surfactant selected from the group consisting of anionic and non-ionic surfactants and a mixture thereof.

2. The process according to claim 1, wherein the added surfactant is nonylphenolpolyglycolether.

3. The process according to claim 1, wherein the added surfactant is isododecylbenzene sulfonate.

4. The process as claimed in claim 1, wherein each polishing agent comprises a silicate of a metal of the group consisting of zirconium, iron, lead, nickel, cobalt, magnesium, calcium, strontium, barium, zinc and aluminium.

5. The process as claimed in claim 1 wherein each polishing agent comprises a fluosilicate of a metal of the group consisting of sodium, potassium, magnesium, calcium, barium, aluminium, and zinc.

6. The process as claimed in claim 1 wherein each polishing agent contains an alkali.

7. The process as claimed in claim 1 wherein the polishing agent used for the second polishing step contains the surfactant in an amount within the range of from 0.5 to 5% by weight, calculated on the polising agent.

8. The process as claimed in claim 1 wherein the duration of the first polishing step is from 10 minutes to 2 hours and the duration of the second polishing step is from 2 to 10 minutes.

9. The process as claimed in claim 1 wherein the semiconductor is selected from the group consisting of silicon and germanium, 10. The process according to claim 1, wherein the size of the solid components of the polishing agent is in the range of 5 to 200 $\mu$m.

* * * * *